(12) United States Patent
Wallace

(10) Patent No.: US 11,690,187 B2
(45) Date of Patent: Jun. 27, 2023

(54) DISPLAY SYSTEM

(71) Applicant: Lenovo (Singapore) Pte. Ltd., Singapore (SG)

(72) Inventor: Brian William Wallace, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 148 days.

(21) Appl. No.: 17/218,478

(22) Filed: Mar. 31, 2021

(65) Prior Publication Data

US 2022/0316648 A1     Oct. 6, 2022

(51) Int. Cl.
*H05K 5/02* (2006.01)
*G06F 1/18* (2006.01)

(52) U.S. Cl.
CPC .......... *H05K 5/0234* (2013.01); *G06F 1/181* (2013.01)

(58) Field of Classification Search
CPC ...... F16M 11/10; F16M 11/046; F16M 11/18; G06F 1/181; G06F 1/1624; G06F 1/1633; G06F 1/166; H05K 5/0234
See application file for complete search history.

(56) References Cited

U.S. PATENT DOCUMENTS

| | | | |
|---|---|---|---|
| 6,381,125 B1* | 4/2002 | Mizoguchi | G06F 1/16 361/678 |
| 2007/0145203 A1* | 6/2007 | Takada | F16M 11/24 248/162.1 |
| 2015/0146359 A1* | 5/2015 | Katsunuma | G06F 1/1601 361/679.22 |
| 2021/0112673 A1* | 4/2021 | Huttula | G06F 1/1641 |

\* cited by examiner

*Primary Examiner* — Anthony Q Edwards
*Assistant Examiner* — Mudakir Hussien
(74) *Attorney, Agent, or Firm* — Brian J. Pangrle

(57) ABSTRACT

A display system can include a stand that includes a base and an arm that extends from the base to an end portion of the arm; and a display housing that includes a display, a rail assembly and an arm socket, translatable via the rail assembly, that receives the end portion of the arm.

20 Claims, 13 Drawing Sheets

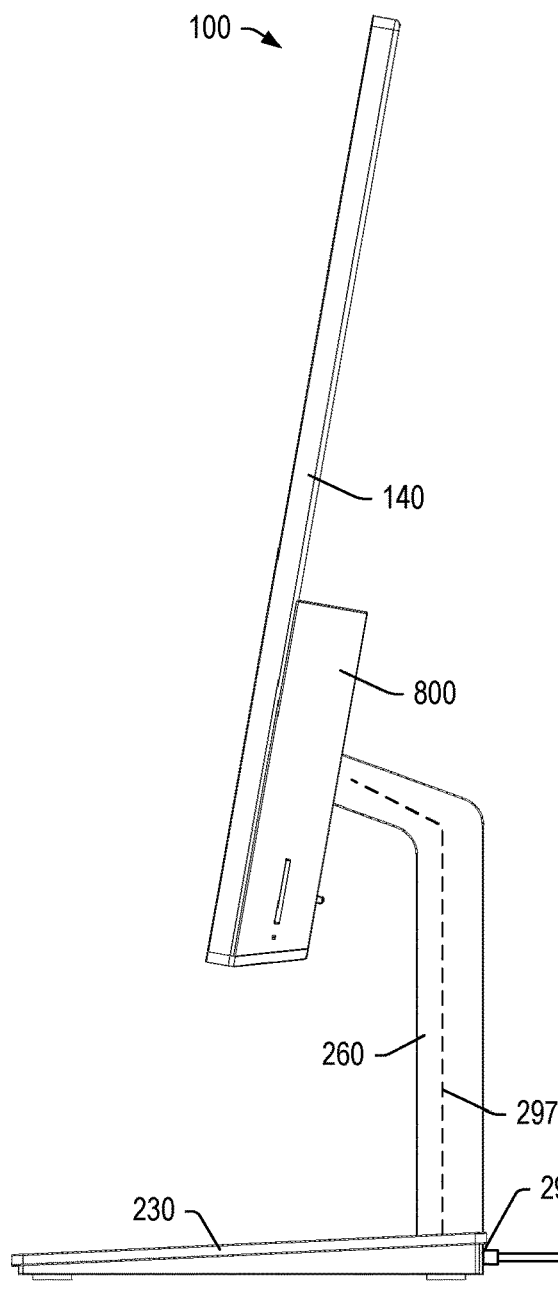
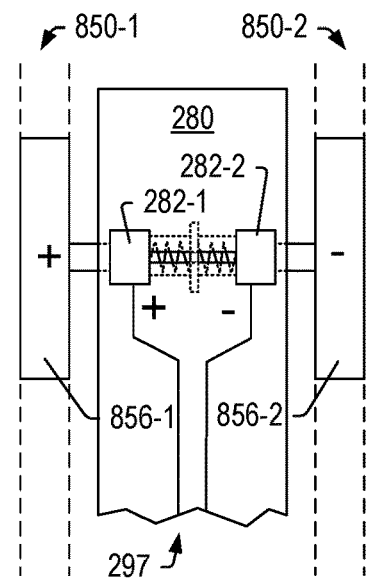
FIG. 11B
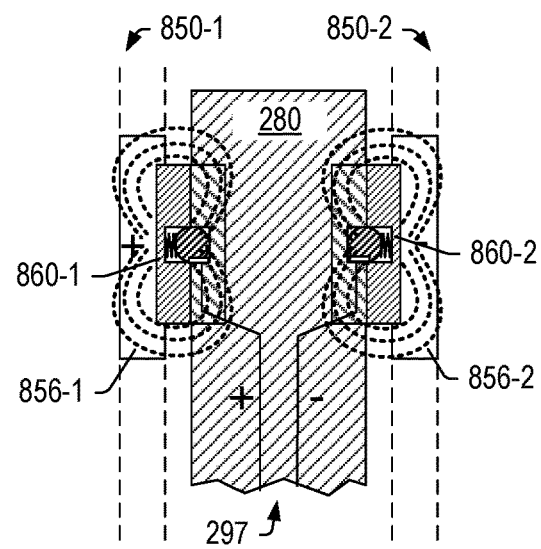
FIG. 11C
FIG. 11A

DISPLAY SYSTEM

TECHNICAL FIELD

Subject matter disclosed herein generally relates to computing and display systems.

BACKGROUND

A display system can include a display housing with a display where the display housing is mounted to an arm for support.

SUMMARY

A display system can include a stand that includes a base and an arm that extends from the base to an end portion of the arm; and a display housing that includes a display, a rail assembly and an arm socket, translatable via the rail assembly, that receives the end portion of the arm. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

FIG. 11A, FIG. 11B and FIG. 11C are a series of views of an example of a display system and examples of portions of a display system;

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
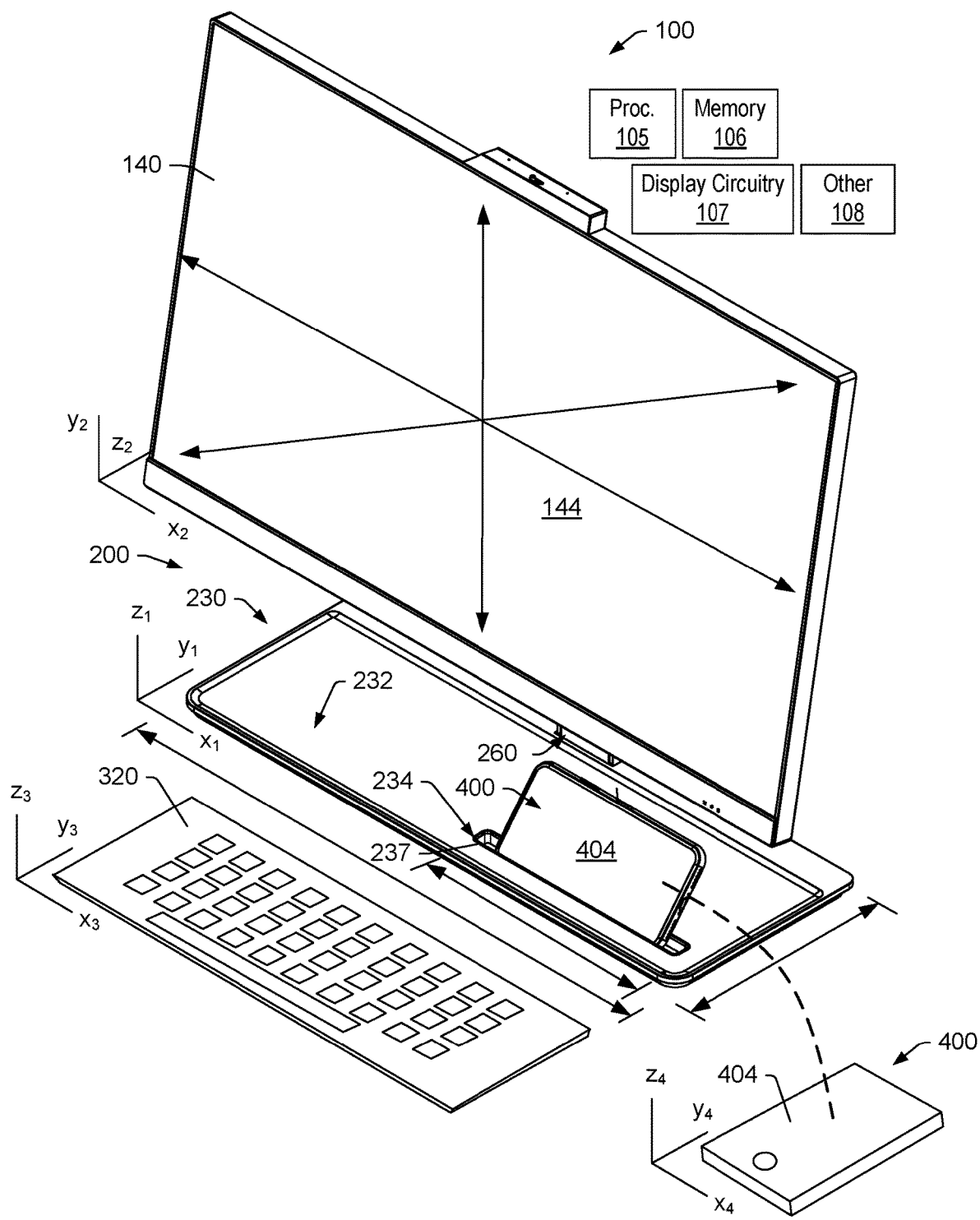
FIG. 1 is a perspective view of an example of a display system.

FIG. 1 shows an example of a computing system 100 that can include one or more processors 105, memory 106 accessible to at least one of the one or more processors 105, display circuitry 107 and one or more other components 108, which can include electronic circuitry, instructions stored in the memory 106 and executable by at least one of the one or more processors 105, etc.

As shown in FIG. 1, the computing system 100 includes a display housing 140 with a display surface 144 that may utilize one or more technologies (e.g., LED, LCD, etc.). The display circuitry 107 can be operatively coupled to at least one of the one or more processors 105, for example, to receive data, instructions, etc., for rendering text, graphics, images, etc., to the display surface 144. As an example, the display circuitry 107 can include one or more graphics processing units (GPUs) and, for example, one or more of the one or more processors 105 can be a central processing unit (CPU). As an example, the display circuitry 107 can include input circuitry such as touch circuitry, digitizer circuitry, etc., such that the display surface 144 is an input surface. For example, the display surface 144 may receive input via touch, a stylus, etc. As an example, the display housing 140 can be a housing for a touchscreen display where a finger, a stylus, etc., can be utilized; noting sensing as to input may occur with or without physical contact between a finger and the display surface 144, between a stylus and the display surface 144, etc., depending on the type of input circuitry utilized (e.g., resistive, capacitive, acoustic wave, infrared, optical, dispersive signal, etc.).

In the example of FIG. 1, the computing system 100 is supported by a stand 200 that includes a base 230 operatively coupled to an arm 260 where the computing system 100 is operatively coupled to the arm 260. As an example, the computing system 100 may be oriented via the stand 200.

In the example of FIG. 1, the base 230 includes a substantially planar upper surface 232, which may include a slot 234 defined in part by an opening 237 in the upper surface 232. As shown, the computing system 100 may be utilized with a keyboard 320, which may be dimensioned for placement on the upper surface 232 of the base 230, for example, to provide an organized workspace (e.g., consider storage of the keyboard 320 on the upper surface 232 when the keyboard is not being used, etc.). As an example, the slot 234 may support a mobile device 400 with a display surface 404, which may be utilized, for example, when the keyboard 320 or other component is not covering the opening 237 of the slot 234 of the base 230. As an example, one or more types of human input devices (HIDs) may be utilized such as, for example, a mouse, a trackpad, a rollerball, etc., to provide input to the computing system 100. As an example, a HID may be a type of peripheral (e.g., a peripheral device).

In the example of FIG. 1, the arm 260 can extend from the base 230 and include an arm mount that couples the arm 260 to the display housing 140, for example, on a back side of the display housing 140 that is opposite the display surface 144 of the display housing 140. As explained, the display surface 144 can be part of a display that includes the display circuitry 107, which may include one or more types of touch, digitizer, etc., circuitry. As shown, the computing system 100, the stand 200, the display housing 140 and/or the display surface 144 can be defined with respect to one or more coordinate systems such as, for example, one or more Cartesian coordinate systems (see, e.g., $z_1$ and $x_2$, $y_2$, $z_2$). The keyboard 320 and the mobile device (e.g., or a peripheral) 400 can be defined with respect to one or more coordinate systems such as, for example, one or more Cartesian coordinate systems (see, e.g., $x_3$, $y_3$, $z_3$ and $x_4$, $y_4$, $z_4$).

As shown in the example of FIG. 1, the display surface 144 may be centered along a centerline of the computing system 100 and may be disposed at an angle that can be defined by the base 230 or a flat support surface such as a desktop, a tabletop, a countertop, etc., where the base 230 or the flat support surface can be planar and horizontal. As shown, the arm 260 rises from the base 230 at an angle that may be normal to the base 230 or the flat support surface (e.g., a 90 degree angle). As to an angle of the display surface 144, it may be 90 degrees, greater than 90 degrees or less than 90 degrees. As to the display surface 404 of the mobile device 400 as positioned with respect to the slot 234, it may be at an angle that is greater than 90 degrees such that it is tilted upwardly in a direction that can correspond to the direction of a user positioned in front of the computing system 100. For example, consider a direction that is substantially aimed at a height of a user's eyes.

As an example, a user may have a viewing zone that can be defined by limits such as an upper limit that corresponds to an angle of zero degrees and a lower limit that is measured downwardly from the upper limit. As an example, the viewing zone may have an optimal range of angles where, for example, the optimal range has a lower limit.

As an example, an optimal viewing angle for eyes may be defined according to the International Standards Organization (ISO ergonomics standards 9241-5). ISO 9241-5 states that an optimal viewing angle, or resting angle, is a −35 degree downward gaze angle from the horizon (e.g., at the level of the eyes). ISO 9241-5 also states that the optimal display placement is in a range of +/−15 degrees from the resting angle (e.g., −20 degrees to −50 degrees). Using the ISO 9241-5, a display surface may be optimally placed to be in a range of −20 degrees to −50 degrees relative to the horizon. The ISO 9241-5 range tends to be a bit lower than most users are accustomed for computer work, but is near a "normal" reading position as used by humans for many years. In this "normal" reading position, a display surface may be more appropriately called chest-height rather than head-height.

As to specific upper and lower limits of ISO 9241-5, it allows for a 0 degree horizontal gaze down to a −60 degrees gaze angle; noting that the lower limit of −60 degree angle may result in some amount of neck strain.

As an example, the computing system 100 can include various connectors that can be for one or more of power and data. For example, consider a power supply cable (e.g., a power supply cord) with a connector at a connector end that can be mated with a connector of the computing system 100. In such an example, the power supply cable may be plugged into an electrical outlet and the computing system 100 to supply power to the computing system 100.

As an example, the computing system 100 can be an all-in-one (AIO) type of computing system. As an example, the computing system 100 and/or the stand 200 can include features that allow one or more cables to be easily routed and substantially hidden from view. For example, with a user positioned in front of the computing system 100 as supported by the stand 200 in the orientation of FIG. 1, one or more cables may not be visible due to being hidden by one or more features of the computing system 100 and/or the stand 200. Such an arrangement can provide for a visually pleasing, uncluttered appearance of the computing system 100, the stand 200 and one or more cables as a system.

Figure 2:
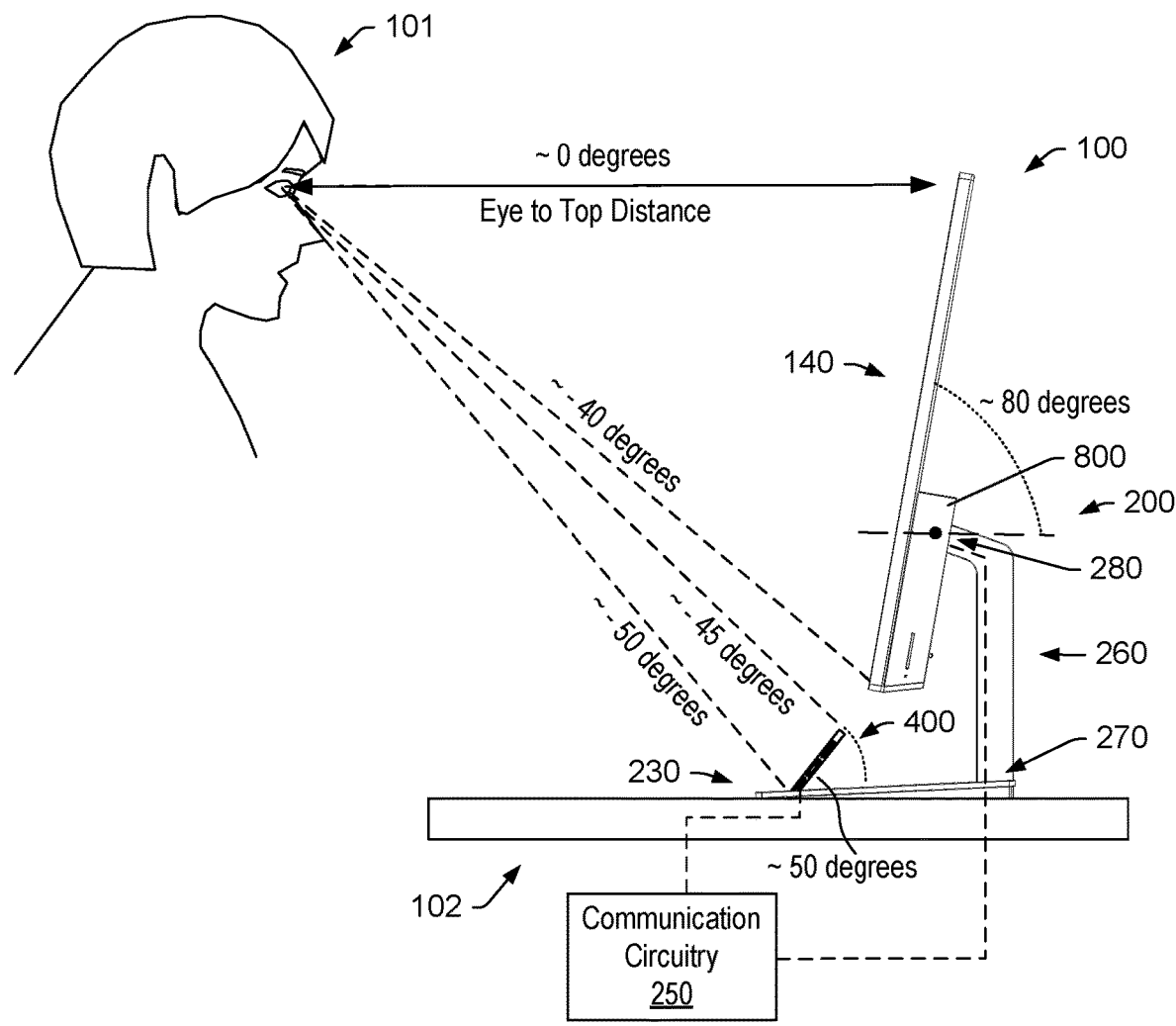
FIG. 2 is a side view of an example of a display system.

FIG. 2 shows a side view of the system 100 with respect to a user 101 and a support surface 102. The position of the user 101 is given as an example, noting that a user may be positioned closer, further, higher or lower than the user 101 with respect to the system 100 and/or the support surface 102 may be positioned closer, further, higher or lower that the position shown with reference to the user 101.

In the example of FIG. 2, the display surface 144 of the display housing 140 is at an angle of approximately 100 degrees with respect to horizontal (see, e.g., angle of approximately 80 degrees as measured to the back side of the display housing 140) and the display surface 404 of the mobile device 400 is at an angle of approximately 130 degrees with respect to horizontal (see, e.g., angle of approximately 50 degrees as measured to the back side of the mobile device 400); thus, the angle of the display surface 404 of the mobile device 400 can be greater than the angle of the display surface 144 of the display housing 140. As an example, the display housing 140 can be adjustable via the arm 260 such that the angle may be adjusted. As shown in the example of FIG. 2, the arm 260 is at approximately 90 degrees (e.g., normal to the support surface 102).

As shown in the example of FIG. 2, a display system can include the stand 200 where the stand 200 includes the base 230 and the arm 260 that extends from the base 230 at a base portion 270 of the arm 260 to an end portion 280 of the arm 260 and can include the display housing 140 that includes a display (see, e.g., the display surface 144 of FIG. 1) and a unit 800 that can include a rail assembly and an arm socket, translatable via the rail assembly, that receives the end portion 280 of the arm 260. In the example of FIG. 2, the unit 800 can be part of the display housing 140 where the arm 260 may be detachable from the unit 800, for example, while the unit 800 is physically part of or otherwise attached to the display housing 140. In the example of FIG. 2, the unit 800 can include a rail assembly such that the display housing 140 and the unit 800 are at least translatable, for example, to move up or down with respect to the stand 200. For example, the stand 200 may be stationary while the display housing 140 and the unit 800 translate, for example, to allow for ergonomic positioning of the display surface 144 for viewing by a user or users.

As an example, the stand 200 may include circuitry such as communication circuitry 250 (e.g., wired and/or wireless) that can provide for communication between circuitry of the mobile device 400 and circuitry of the display housing 140, which can include circuitry of the unit 800 (e.g., where present). For example, consider the unit 800 as including one or more electric motors where the mobile device 400 may render a graphical user interface (GUI) to its display such that a user can instruct one or more of the one or more electric motors to cause the display housing 140 to move up or down or, for example, to rotate where rotational features are provided. As an example, the display housing 140 may render a GUI to its display surface 144 for receipt of one or more instructions to instruct one or more electric motors. In the mobile device based approach, a user may be able to view the display of the mobile device 400 without the display of the mobile device moving; whereas, for the display housing based approach, the display itself may move and thereby make a user's experience less than optimal as the user has to adjust her gaze as the display moves. For example, consider a user contacting the display of the mobile device 400 with a finger of the right hand to make a gesture to move the display housing 140 up or down. In such an example, the mobile device 400 can be stationary and remain stationary.

In various instances, a display system can include a lift mechanism that is built into a stand and not built into a display housing. For example, consider a stand with an arm that can translate upwardly or downwardly for positioning of a display housing and its display. Such an approach can demand calibration of the lift mechanism of the stand, particularly where the stand is to be utilized for different display housings. For example, consider a heavy display housing and a light display housing where the heavy display housing demands a lift mechanism that can support its weight at a desired position without changing position (e.g., creeping up or creeping down). In various instances, a translation mechanism or lift mechanism of a stand is to have a spring or springs that can help to support the weight of a display housing at a desired elevation without pushing it further up or allowing it to settle down. In various instances, a balance is met between spring force, mass and friction force. As the mass (e.g., weight) of the display housing is a factor, the lift mechanism is generally tailored for a particular mass (e.g., weight) or a narrow range of masses (e.g., a narrow range of weights). As such, a stand with an integral lift mechanism that is suitable for one display housing may not be suitable for other display housings or may be suitable for a small number of display housings where one or more weight related adjustments (e.g., torque, balance, etc.), calibrations, etc., are required for proper functioning.

In the example of FIG. 2, a lift mechanism can be present in the unit 800 such that a stand may be suitable for one or more different display housings without having to make an adjustment to the stand. In such an approach, a unit such as the unit 800 may be provided with a display housing and be out-of-the-box ready to mount to a stand, optionally without demanding that a user perform adjustment(s), calibration(s), etc.

As an example, display housings, each with a unit that includes at least a translation mechanism, may be suitable for use of a common stand, or a stand with common specifications (e.g., shape, size, etc.). Such an approach may reduce costs, complexity and number of parts for manufacturing a stand. As an example, a stand may be made more aesthetically pleasing, more streamlined in appearance, etc. (e.g., consider a slim and elegant stand) when compared to a stand that includes a lift mechanism.

As shown in the example of FIG. 2, the unit 800 can be a rear bump out region of the display housing 140 (see also FIG. 4B) where the unit 800 includes a lift mechanism; rather than the stand 200. In such an example, the display housing 140 and the unit 800 may be relatively "stand agnostic" in that a stand, a mount, etc., includes a particular end portion that can be operatively coupled to the unit 800. In such an approach, the number of types of stands or mounts that may be suitable for the display housing 140 may be readily increased. For example, consider a fixed stand that is mounted via bolts to a desktop, a podium, a wall, etc. and/or a movable stand that includes a sufficiently sized and/or shaped base. In various examples, a stand may be suitable for coupling to one or more different display housings.

As an example, the unit 800 may include one or more features that may be tiered. For example, consider an all-in-one approach where the unit 800 can include one or more processors, different amounts of memory (e.g., RAM, etc.), etc. As an example, a unit such as the unit 800 may be a dummy unit or may not be provided with a lift mechanism where a display housing does not demand translation up and down.

Figure 3A:
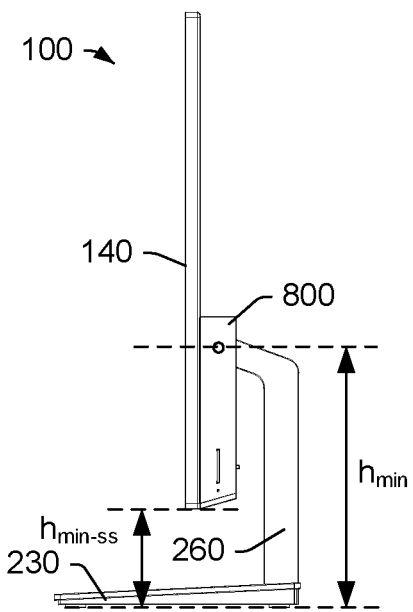
FIGS. 3A, 3B, 3C and 3D are a series of side views of examples of a display system.
Figure 3B:
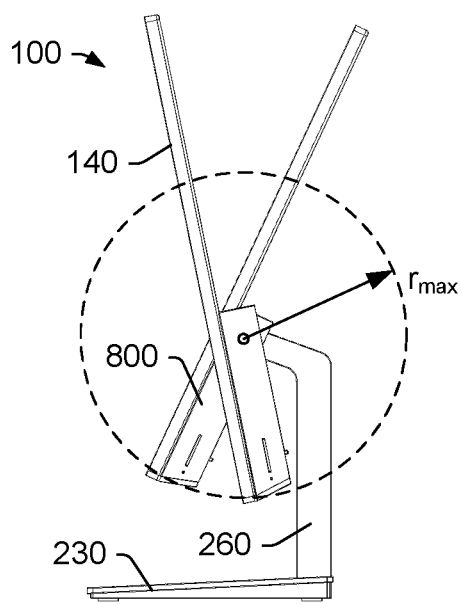
Figure 3C:
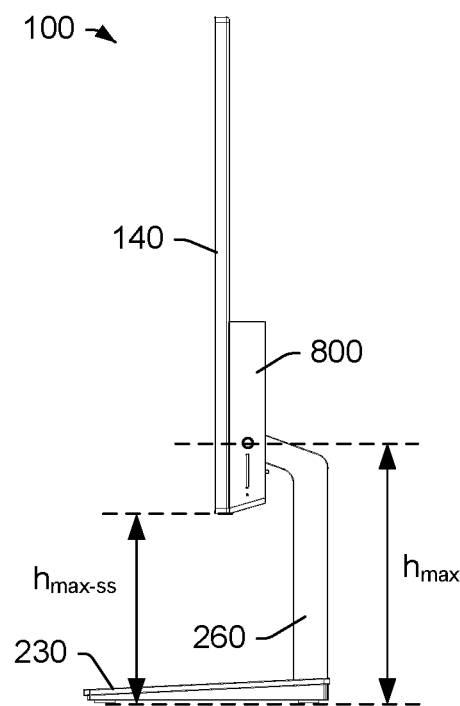
Figure 3D:
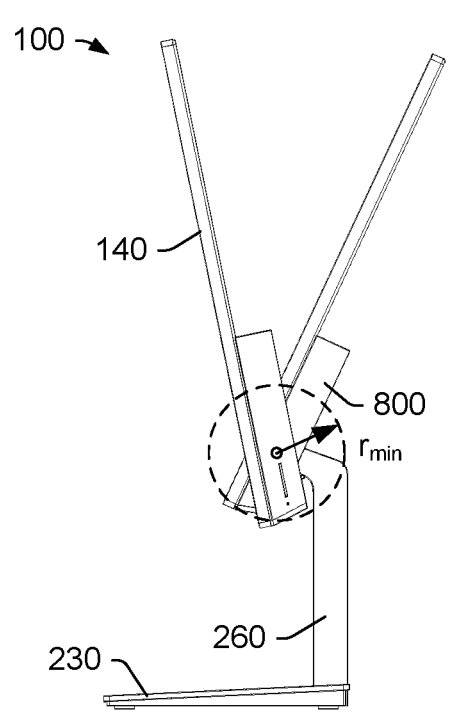

FIGS. 3A, 3B, 3C and 3D show various positions of the display housing 140 with respect to the base 230 and the arm 260 of the stand 200. In FIG. 3A, heights are shown between a support surface and a bottom edge of the display housing 140 ($h_{min\text{-}ss}$) and between the support surface and a point where the end portion 280 of the arm 260 may couple to the unit 800, which may be a minimum height ($h_{min}$). In FIG. 3B, rotational angles are shown where a radius measured from the point to the bottom edge of the display housing 140 is shown as being relatively large, which may be a maximum radius ($r_{max}$). In FIG. 3C, heights are shown between the support surface and the bottom edge of the display housing 140 ($h_{max\text{-}ss}$) and between the support surface and the point where the end portion 280 of the arm 260 may couple to the unit 800 where such heights are greater than those shown in FIG. 3A (e.g., compare $h_{min}$ and $h_{max}$). In FIG. 3D, rotational angles are shown where the radius measured from the point to the bottom edge of the display housing 140 is shown as being smaller than that in FIG. 3B (e.g., compare $r_{max}$ and $r_{min}$). Thus, where rotation is provided for, the radius of rotation of the bottom edge of the display housing 140 can become smaller when the display housing 140 has been translated upwardly; whereas, a radius of rotation of an upper edge of the display housing 140 can become larger (e.g., larger than in the example of FIG. 3B).

Figure 4A:
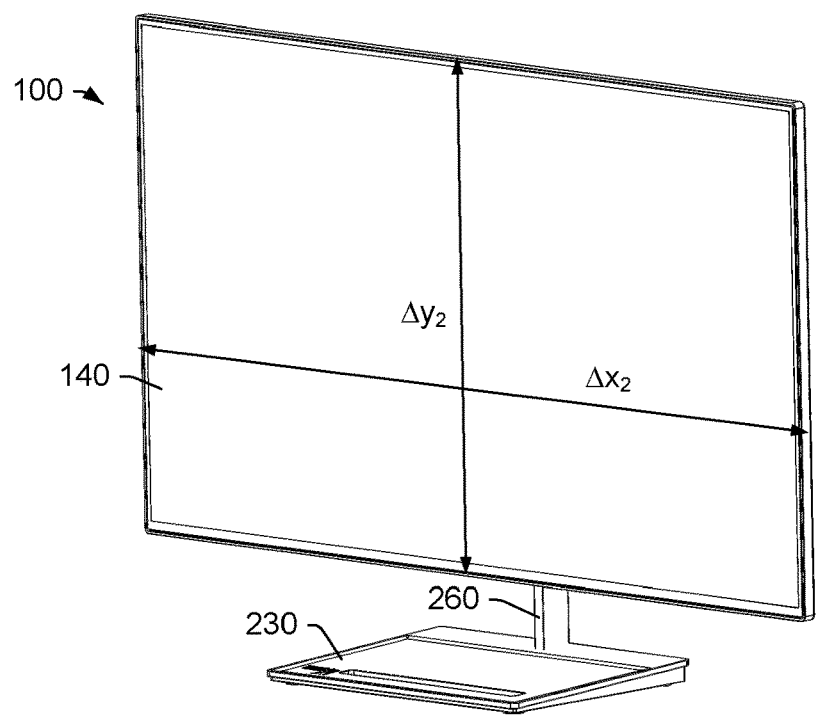
FIG. 4A and FIG. 4B are a series of views of an example of a display system.
Figure 4B:
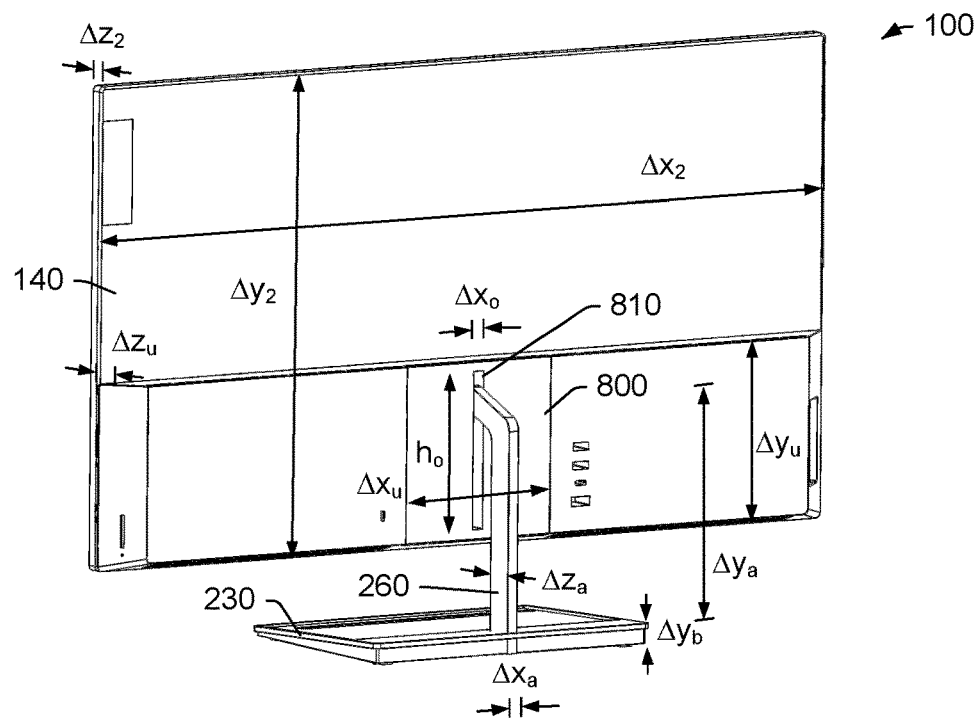

FIGS. 4A and 4B show perspective views of an example of the system 100 where the unit 800 is shown in the back perspective view of FIG. 4B. As shown, the arm 260 can be relatively streamlined in that it may be formed of a plate (e.g., a metallic plate, a composite material plate, etc.). As shown, the plate shaped arm 260 may be oriented with its narrow dimension measured side to side, extending from front to back, which may be more resistant to deformation than if oriented with its narrow dimension extending from side to side. As shown in the example of FIG. 4B, the unit 800 can include an opening 810 such as a slot shaped opening (e.g., rectangular, etc.) such that the unit 800 and the display housing 140 can be translated upwardly and downwardly with respect to the arm 260 of the stand 200.

As shown in FIG. 4A and FIG. 4B, the display housing 140 can be of dimensions $\Delta x_2$ and $\Delta y_2$ and have a thinner region $\Delta z_2$ where the unit 800 is thicker, $\Delta z_u$, than the region with the thickness $\Delta z_2$. Also shown in FIG. 4B is a height of the opening 810, $h_o$, and a width of the opening $\Delta x_o$. As shown, the arm 260 is formed as a plate with a thickness $\Delta x_a$, which is less than the width of the opening $\Delta x_o$. The arm 260 can also be defined via a front to back dimension $\Delta z_a$ and a height $\Delta y_a$ (e.g., a fixed height). As shown, the base 230 can also be defined via a height $\Delta y_b$ where the base may have a slope, for example, from back to front. As an example, the height of the arm 260 may be a sum of the height of the arm 260 $\Delta y_a$ and the height of the base 230 $\Delta y_b$; noting that the coordinate system $x_1$, $y_1$ and $z_1$ of FIG. 1 may be utilized to defines one or more aspects of the stand 200 (e.g., the base 230 and/or the arm 260). In the example of FIG. 4A and FIG. 4B, the unit 800 can have a height $\Delta y_u$ and a width $\Delta x_u$, which may be a central portion of a bumped out region or may be an entire bumped out region.

As shown in the example of FIG. 4B, the opening 810 can be of a height $h_o$ that is less than approximately 50 percent of the height $\Delta y_2$ of the display housing 140. As shown in the example of FIG. 4B, the unit 800 is located in the lower 50 percent of the display housing 140. As an example, a lower location for the unit 800 may help to keep the center of gravity (e.g., center of mass) lower, which may provide for a more compact base, less risk of tipping, etc. As explained, the upper portion of the display housing 140 may be made to be relatively thin, which can help to reduce the mass of the display housing 140 and to help keep the center of gravity (e.g., center of mass) lower. In various examples, where the display housing 140 may be rotatable about the arm 260, maintaining a low center of gravity (e.g. center of mass) of the display housing 140 may help to reduce risk of tipping of the system 100.

Figure 5A:
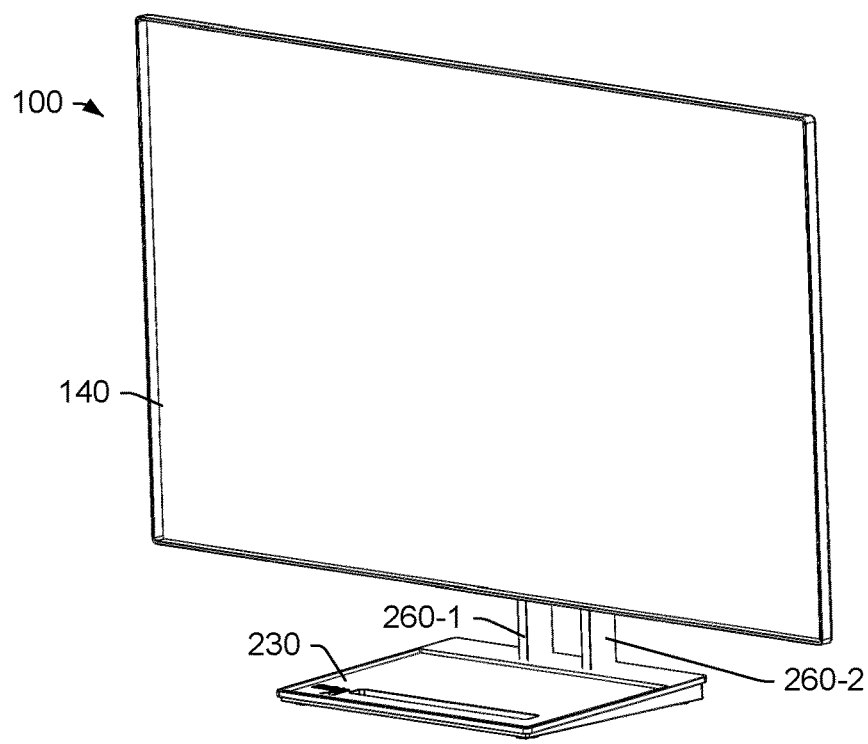
FIG. 5A and FIG. 5B are a series of views of an example of a display system.
Figure 5B:
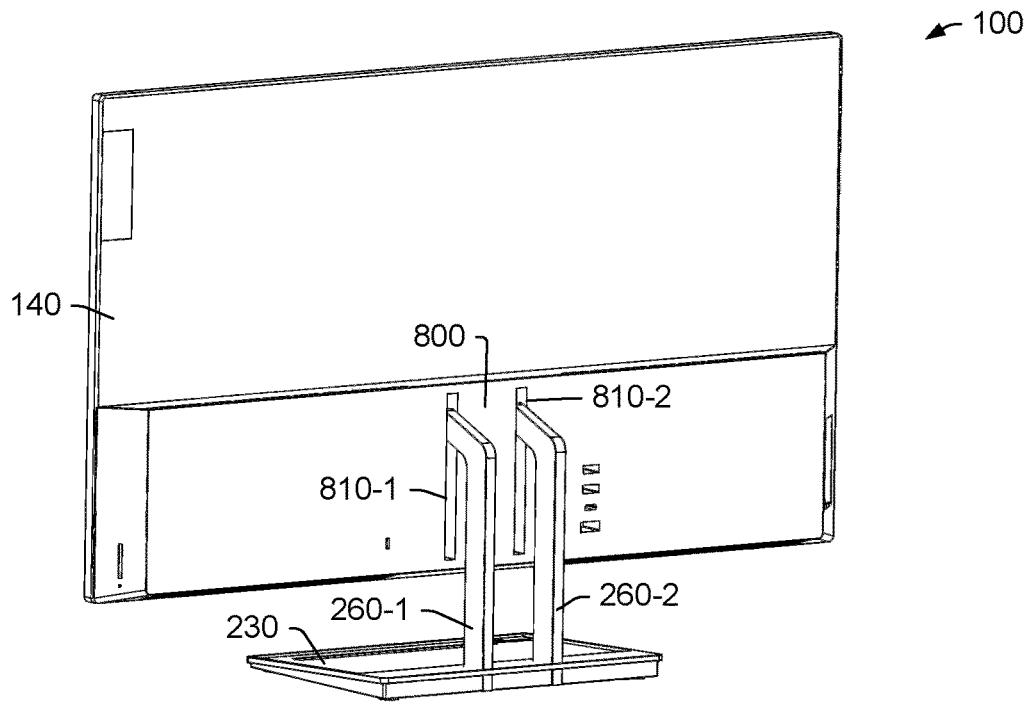

FIGS. 5A and 5B show perspective views of an example of the system 100 where the unit 800 is shown in the back perspective view of FIG. 5B. As shown, the system 100 may include multiple arms 260-1 and 260-2 that may be relatively streamlined in that they each may be formed of a plate (e.g., a metallic plate, a composite material plate, etc.). As shown, the plate shaped arms 260-1 and 260-2 may be oriented with their narrow dimension front to back, which may be more resistant to deformation than if oriented with their narrow dimension from side to side. As shown in the example of FIG. 5B, the unit 800 can include one or more openings 810-1 and 810-2 such as one or more slot shaped openings such that the unit 800 and the display housing 140 can be translated upwardly and downwardly with respect to the arms 260-1 and 260-2 of the stand 200. Various dimensions described with respect to FIG. 4A and/or FIG. 4B may be utilized to describe various features in FIG. 5A and/or FIG. 5B. As shown, in FIG. 5B, the unit 800 may be of a greater width than the unit 800 shown in FIG. 4B.

Figure 6A:
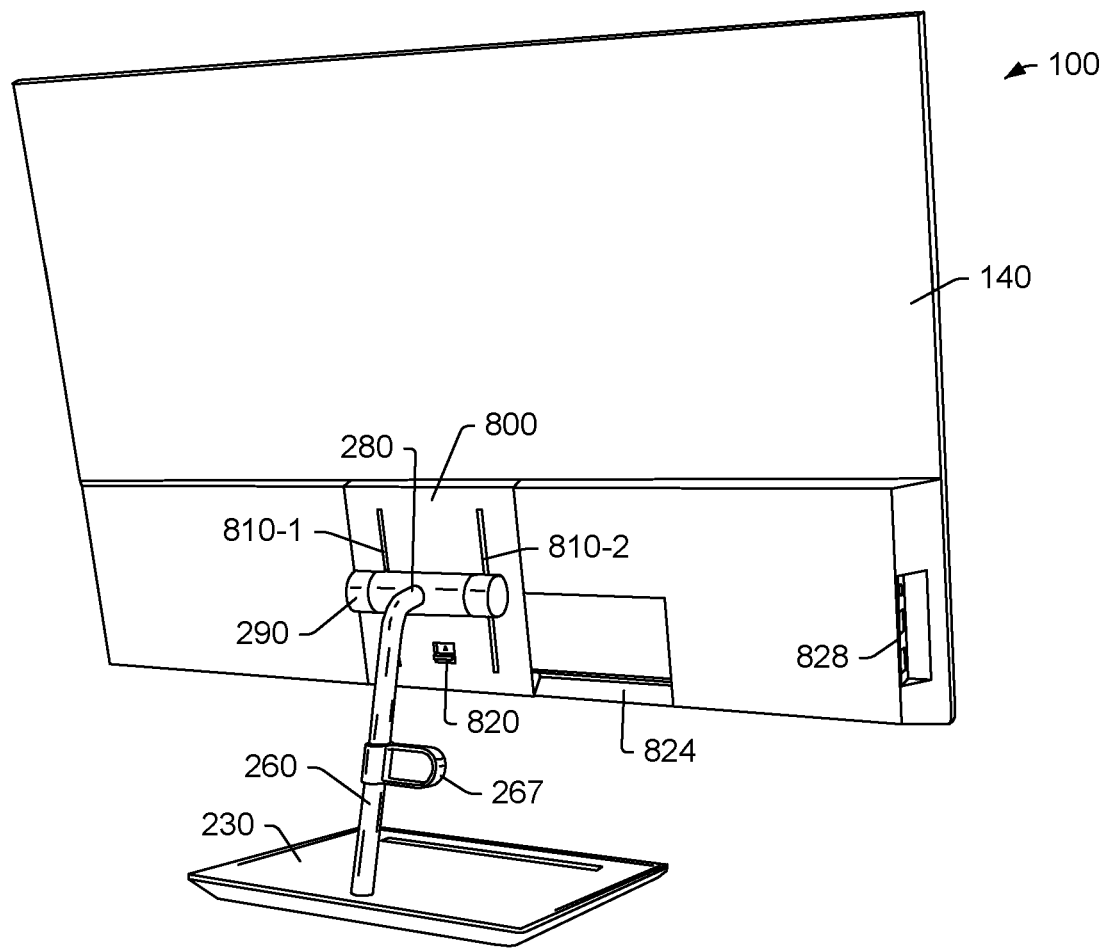
FIG. 6A and FIG. 6B are a series of views of an example of a display system or a portion thereof.

FIG. 6A shows a perspective view of an example of the system 100 where the unit 800 includes the two openings 810-1 and 810-2 and where the display housing 140 and/or the unit 800 can include a release 820, connectors 824 and connectors 828. In the example of FIG. 6A, the arm 260 is shown as including a cable guide 267 that may be utilized to help organize and/or support one or more cables that may, for example, be connected to one or more of the connectors 824 and 828 (e.g., for power, data, power and data, etc.). As to the release 820, it may provide for release of the arm 260 from the unit 800.

Figure 6B:
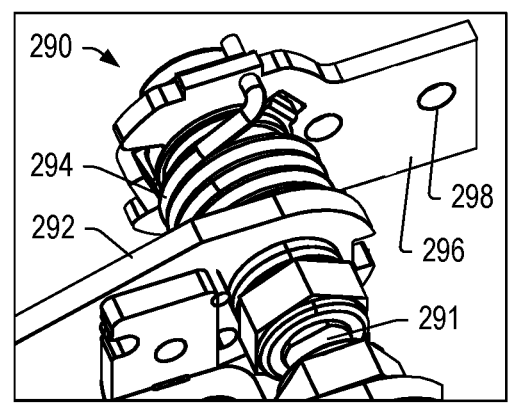

In the example of FIG. 6A, the end portion 280 of the arm 260 includes a rotational mechanism 290 that is external to the unit 800 and that allows for rotation of the display housing 140 and the unit 800 about a rotational axis. FIG. 6B shows an example of the rotational mechanism 290 as including an axle 291, a support 292, a spring 294 and a coupling 296 with a coupling feature 298 (e.g., an opening, a socket, a hook, etc.) where the coupling 296 is rotatable about the rotational axis defined by the axle 291 and biased by the spring 294. In such an example, the support 292 can be stationary while the coupling 296 can rotate such that, where the coupling 296 is connected to the unit 800, the unit 800 and the display housing 140 are rotatable. In such an example, the unit 800 and the display housing 140 can be rotatable and translatable where the arm 260 may be fixed in height such that it does not translate.

Figures 7A, 7B:
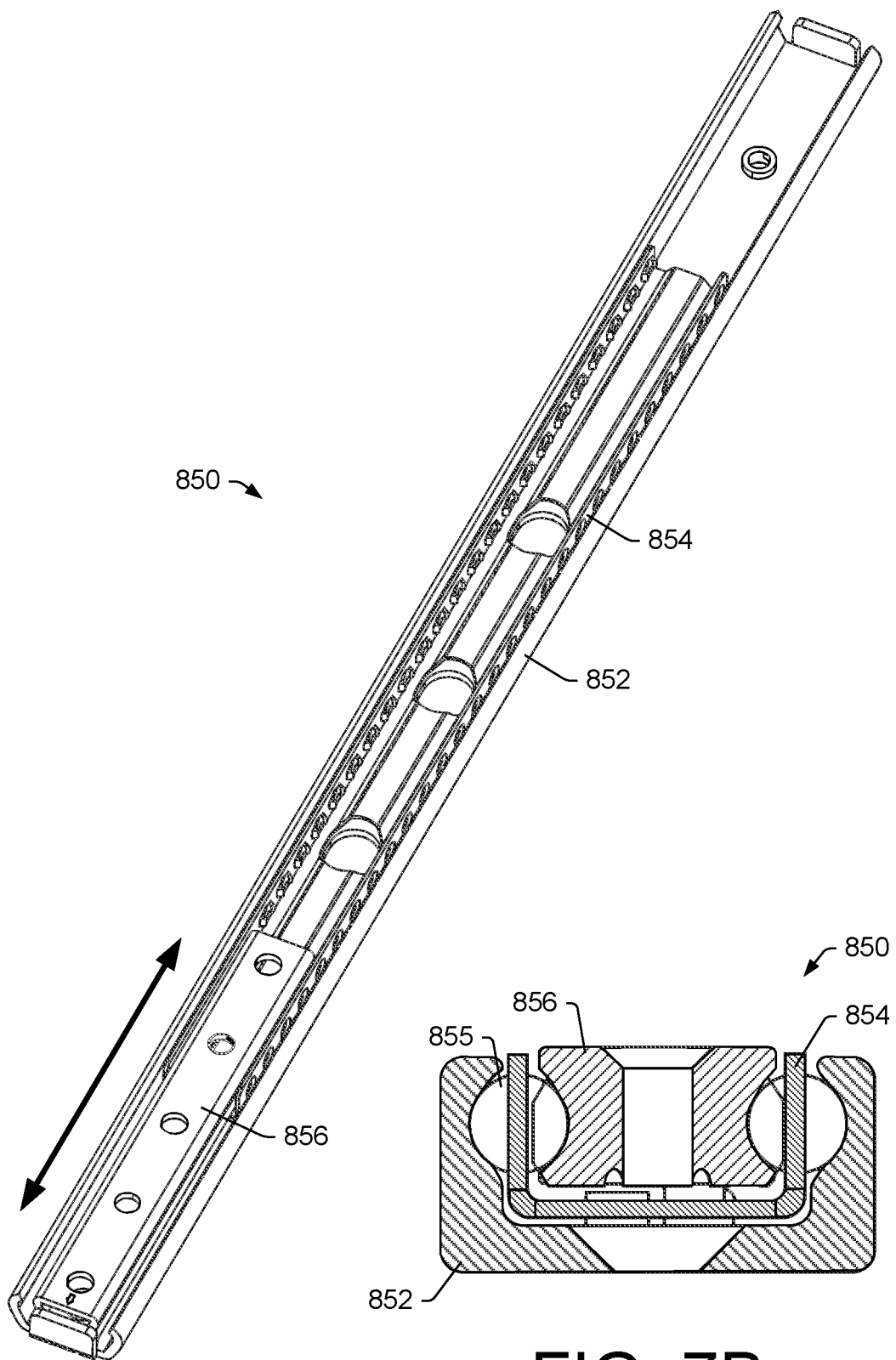
FIG. 7A and FIG. 7B are a perspective view and a cross-sectional view of an example of a rail assembly.

FIG. 7A shows a perspective view of an example of a rail assembly 850 that includes multiple components such as, for example, an outer race rail 852, a guide rail 854, and an inner race rail 856 (e.g., a slider). FIG. 7B shows an example of a cross-sectional view of the rail assembly 850 where rolling elements 855 can be disposed between the outer race rail 852 and the inner race rail 856 where the guide rail 854 can help to support the rolling elements 855. As an example, rolling elements may be balls, cylindrical rollers, cone rollers, etc. In the examples of FIGS. 7A and 7B, the outer race rail 852 may be fixed within the unit 800 and the inner race rail 856 may be coupled to one or more features at the end portion 280 of the arm 260. For example, consider the inner race rail 856 as including openings that can be engaged by a feature of the end portion 280 of the arm 260.

As an example, the inner race rail 856 may be relatively short though sufficiently long to engage the rolling elements 855 for support (e.g., to maintain parallel alignment, etc.).

As an example, the inner race rail 856 may include a single coupling feature, a pair of coupling features, etc. As an example, an amount of friction may exist within the rail assembly 850 such that the inner race rail 856 may be maintained in a particular position when loaded to a certain amount of force. As an example, the inner race rail 856 may be operatively coupled to a spring, a band, gears, etc., which may help to maintain its position under load (e.g., under load of a display housing, etc.). As an example, the inner race rail 856 may be referred to as a translating rail, a translating coupling or a slider (e.g., a component or sub-assembly that can slide in a rail assembly, etc.).

As an example, a holding load may be sufficient for supporting a display housing while being readily overcome by hand or hands when a user wants to translate the display housing (e.g., applying an upward force to move the display housing up or a downward force to move the display housing down). In various examples, an electric motor or electric motors may be utilized for moving a display housing with respect to a stand. In such examples, an electric motor or electric motors may overcome a holding force and/or control application and/or release of a holding force. For example, consider a stepper motor that may have a holding force when powered (e.g., via electromagnets and/or permanent magnets) and/or not powered (e.g., via one or more permanent magnets, etc.).

As an example, as shown in FIG. 6B, a feature may be an opening, such as the feature 298, where a feature of a rail assembly (e.g., a translating race) may engage the opening. As explained, an end portion of an arm of a stand may engage a rail assembly of a unit such that the unit and a display housing can translate up and down while the end portion of the arm of the stand remains stationary.

In various examples, a display system can include one or more constant force springs. For example, a constant force may be a type of a clock spring, which may be formed as a roll of a prestressed strip that exerts a nearly constant restraining force to resist uncoiling. In such an example, the force can be substantially constant where the change in the radius of curvature is substantially constant (e.g., noting that there can be some change in coil diameter, due to buildup). As an example, a spring may exhibit substantially constant torque. As an example, a constant force spring may be utilized in a rail assembly or rail assemblies (e.g., consider counterbalance springs for window sashes). In various examples, a rail assembly can include a slider, which may be an inner race rail or other component that is guided by a guide rail. In such an example, the slider may be operatively coupled to a constant force spring. In such an example, translation of the slider may cause rolling or unrolling of a constant force spring or rolling and unrolling of a pair of constant force springs (e.g., an upper spring and a lower spring). As an example, one or more constant force springs may help to maintain a display housing at a particular desired height and/or at a particular desired angle while mounted to an end portion of an arm, which may be an arm of a stand.

Figure 8A:
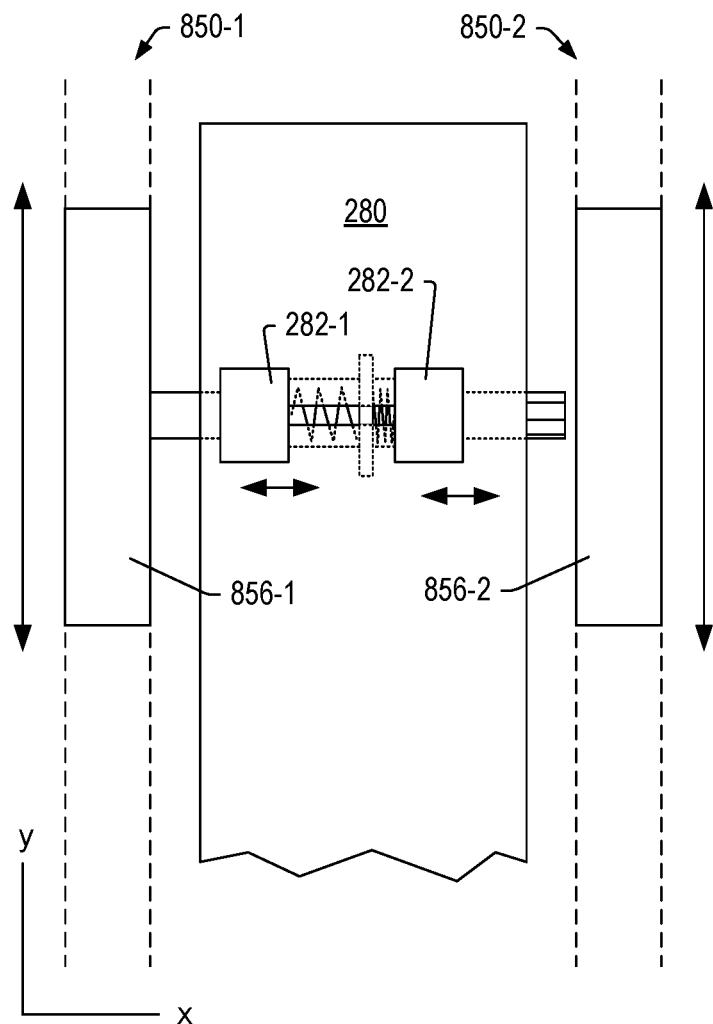
FIG. 8A, FIG. 8B, FIG. 8C and FIG. 8D are a series of views of examples of portions of a display system.
Figure 8B:
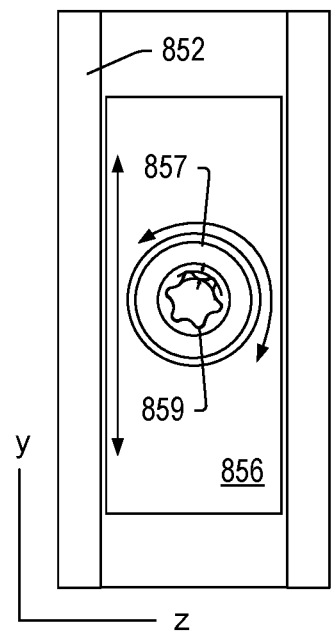
Figure 8C:
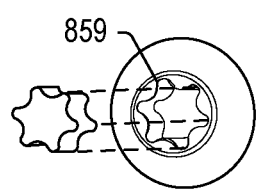

FIGS. 8A, 8B, 8C and 8D show various examples of features that may be included with the unit 800 and/or with the end portion 280 of an arm. FIG. 8A shows an x, y coordinate system while FIG. 8B shows a y, z coordinate system, both of which may be part of an x, y, z Cartesian coordinate system. As shown, two or more rail assemblies 850-1 and 850-2 may be included where each includes a translating rail 856-1 and 856-2 that can be coupled to the end portion 280 of an arm. In the example of FIG. 8A, the end portion 280 can include pegs 282-1 and 282-2 that can be received by sockets such as an example socket 859 shown in FIG. 8B and FIG. 8C. In such an example, sockets and pegs can be keyed with a key and a keyway such that the pegs and sockets do not rotate with respect to each other. As shown in FIG. 8B, the socket 859 may be a rotatable socket 857 as may be biased with a spring, an interference fit, an electric motor, etc. For example, consider the socket 859 as being formed on a rotatable axle that can be set in a bore, a bushing, etc., such that the unit 800 can be rotated with respect to the end portion 280. In the example of FIG. 8A, the pegs 282-1 and 282-2 may be fixed in their orientation or may be slightly rotatable until being received by a corresponding socket. For example, the pegs 282-1 and 282-2 may be rotatable keys that are each rotatable for alignment with a respective keyed socket where, upon receipt by a respective keyed socket, each of the pegs 282-1 and 282-2 are locked (e.g., prohibited from rotation). For example, one a peg aligns with a socket, a spring may force the peg into the socket and upon so doing lock the peg such that it does not rotate with respect to the end portion 280. In such an approach, rotation may be accomplished via the rotatable socket 857; noting that each of the rail assemblies 850-1 and 850-2 may include a respective rotatable socket.

Figure 8D:
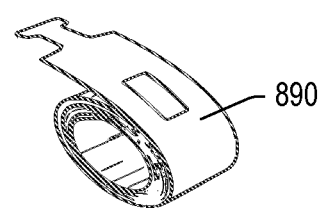

FIG. 8D shows an example of a spring 890, which may be a constant force spring that can be utilized for one or more purposes (e.g., coupled to a slider, coupled to a socket, etc.). As an example, the rotatable socket 857 may be operatively coupled to the spring 890, which may aid in maintaining a rotated position of a display housing with respect to the end portion 280. As explained, a slider such as one of the translating rails 856-1 and/or 856-2 may be operatively coupled to a spring such as, for example, the spring 890 (e.g., consider a tab portion coupled to a translating rail such that the spring 890 coils or uncoils as the translating rail translates).

In the example of FIG. 8A, a user may be able to access at least a portion of the pegs 282-1 and 282-2, for example, to couple the end portion 280 to the rail assemblies 850-1 and 850-2 and/or to decouple the end portion 280 from the rail assemblies 850-1 and 850-2.

Figure 9:
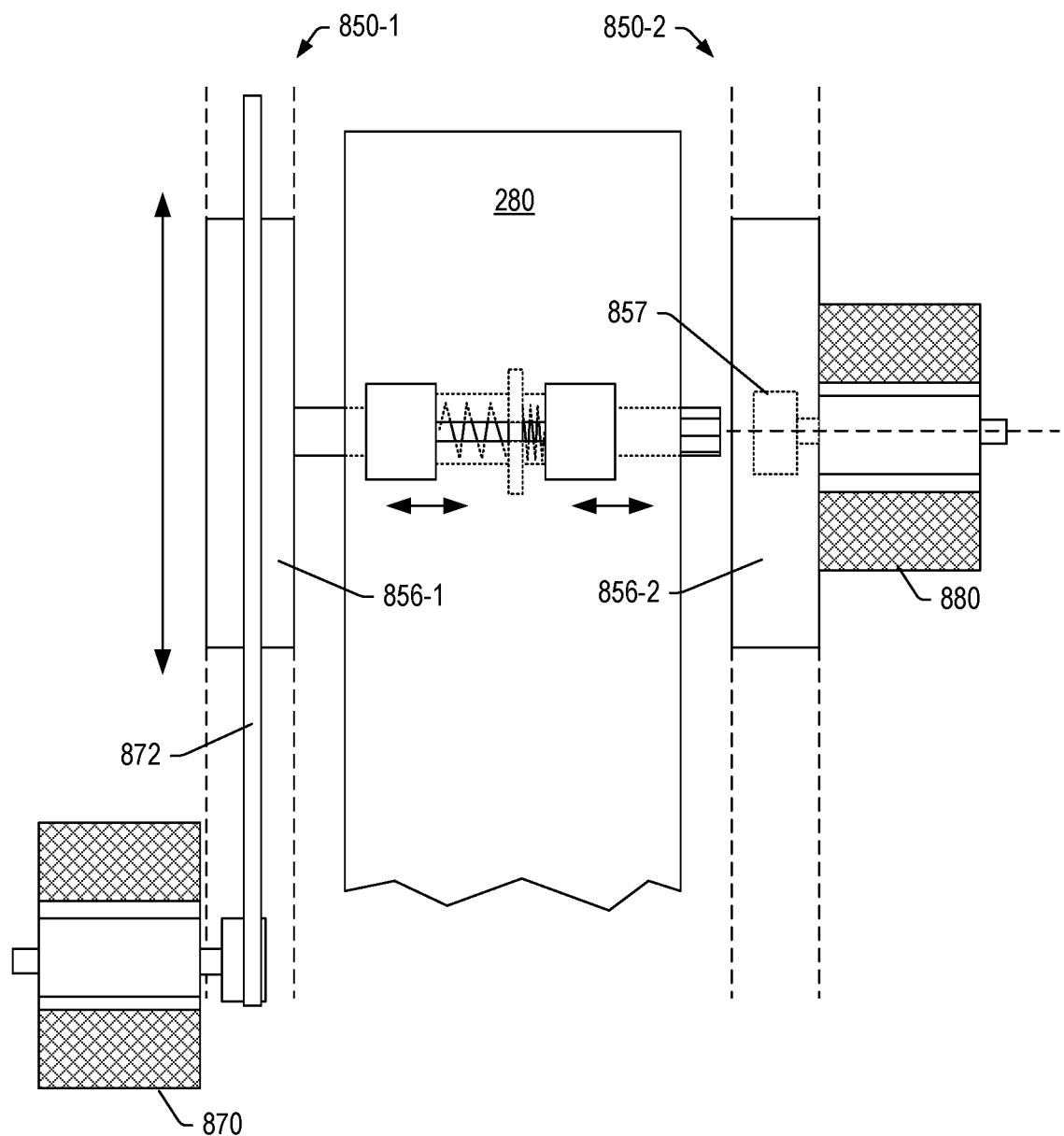
FIG. 9 is a view of an example of a portion of a display system.

FIG. 9 shows an example of the rail assemblies 850-1 and 850-2 with one or more electric motors 870 and 880. As shown, the electric motor 870 may be operatively coupled to the translating rail 856-1 (e.g., an inner race rail, etc.), for example, via a chain, a band, gears, etc. As shown, the electric motor 880 may be operatively coupled to the rotatable socket 857 and, for example, carried by the translating rail 856-2.

As an example, a unit can include one or more electric motors for translating and/or rotating the unit with respect to an end portion of an arm. For example, the unit 800 can include one or both of the electric motors 870 and 880 to provide for translation and/or rotation of the unit 800 with respect to the end portion 280 of the arm 260. As mentioned with respect to the example of FIG. 2, a mobile device may be operable to receive instructions (e.g., via a microphone, a graphical user interface, etc.) that can be transmitted to one or more electric motors such that a display housing can be adjusted (e.g., translated and/or rotated). As an example, a stand may include a base with one or more control features such as, for example, one or more control buttons, a control surface, etc., where signals can be issued therefrom to cause one or more electric motors to adjust a display housing (e.g., translate and/or rotate).

Figure 10A:
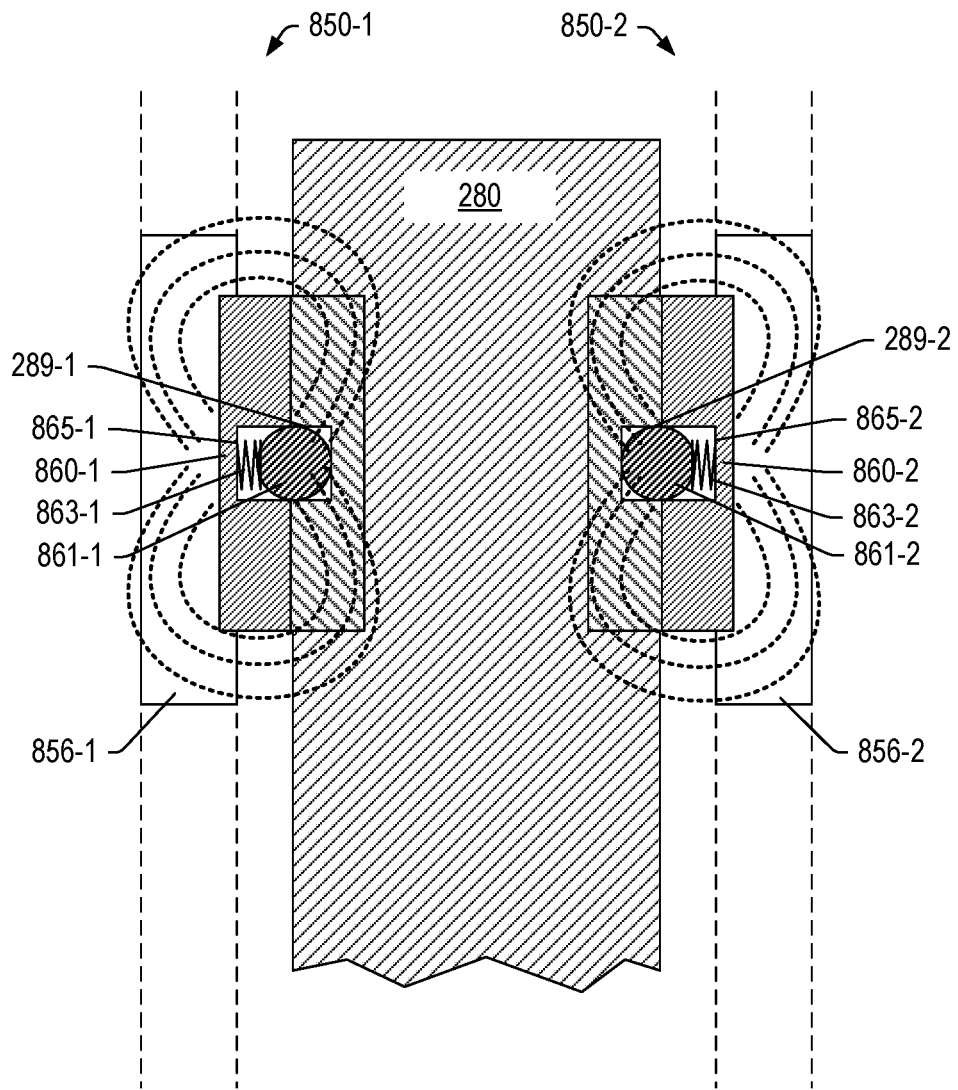
FIG. 10A and FIG. 10B are a series of views of examples of portions of a display system.

FIG. 10A shows an example of the rail assemblies 850-1 and 850-2 where the translating rails 856-1 and 856-2 can couple to the end portion 280 of the arm via one or more magnets, which may be magnets 860-1 and 860-2 carried by the translating rails 856-1 and 856-2, respectively. In such an example, one or more mechanisms may be included that can facilitate coupling and/or otherwise strengthen coupling. For example, consider one or more spring loaded components 861-1 and 861-2 as loaded by springs 863-1 and 863-2 that can lock into the end portion 280 of the arm. In such an example, the spring loaded components 861-1 and 861-2 may recess into the translating rails 856-1 and 856-2 into sockets 865-1 and 865-2, respectively, such that the end portion 280 can be received between the translating rails 856-1 and 856-2. Where the end portion 280 includes receptacles 289-1 and 289-2, the spring loaded components 861-1 and 861-2 may be forcibly received by the receptacles 289-1 and 289-2 such that a mechanical coupling is made that may help align and/or strengthen a magnetic force based coupling. Upon application of force (e.g., manual force) to remove the end portion 280 from the rail assemblies 850-1 and 850-2, the spring loaded components 861-1 and 861-2 may recess into the sockets 865-1 and 865-2 such that the end portion 280 can be decoupled from the rail assemblies 850-1 and 850-2.

Figure 10B:
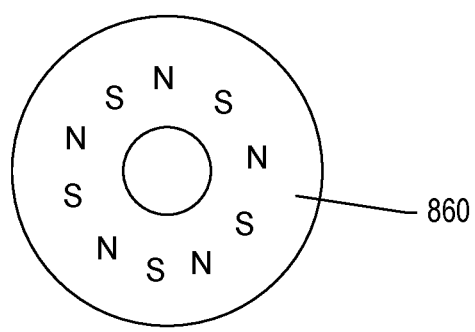

FIG. 10B shows an example of a magnet 860 that may be utilized in the example of FIG. 10A. As shown, one or more magnets may be provided that have or generate poles where, for example, a series of poles exist. FIG. 10B shows an approximate example where poles may be oriented at different angles about the magnet 860, which may be a circular shaped magnet. In such an example, consider poles that are disposed at a series of angles such that the translating rails 856-1 and 856-2 can be rotated to an angle (e.g., via rotation of the display housing 140) where poles attract to support the translating rails 856-1 and 856-2 at that angle. As the translating rails 856-1 and 856-2 can be part of a unit 800 that is coupled to or part of a display housing, the display housing may be rotatable via utilization of the magnets while also being translatable via the translating rails 856-1 and 856-2.

FIG. 11A shows a side view of an example of the system 100 where the stand 200 includes a power socket 295 and a conductor or conductors 297 that electrically couple the power socket 295 to circuitry of the unit 800 and/or circuitry of the display housing 140. In such an example, a power adapter 191 may be an AC/DC power adapter that can plug into the power socket 295 (e.g., via a suitable plug) to supply the unit 800 and/or the display housing 140 with power (e.g., DC power).

As shown in FIG. 11B, pegs may be utilized to couple conductors. As shown in FIG. 11C, magnets may be utilized to couple conductors. As shown, the conductors 297 may carry DC power and hence pose a relatively low risk of shock to a user or other human. In the examples of FIGS. 11A, 11B and 11C, the conductors 297 may be hidden (e.g., embedded) within the arm 260, which may provide for a relatively clean and uncluttered appearance.

As an example, the housing display 140 and the unit 800 may form an all-in-one computing system. In such an example, the display housing 140 and the unit 800 may appear cordless but for a single cord that couples to the connector 295, which may be part of the arm 260 or part of the base 230. As explained with respect to the examples of FIG. 11B and FIG. 11C, the end portion 280 of the arm 260 can include features for physically and electrically coupling the end portion 280 to the unit 800. In such examples (e.g., and in various other examples), the coupling(s) may be hidden from a user's view, which can provide a relatively clean, sleek and aesthetically pleasing system (e.g., compared to an arm with a lift mechanism and a separate cable that runs from a power source to a display housing, etc.).

Figure 12:
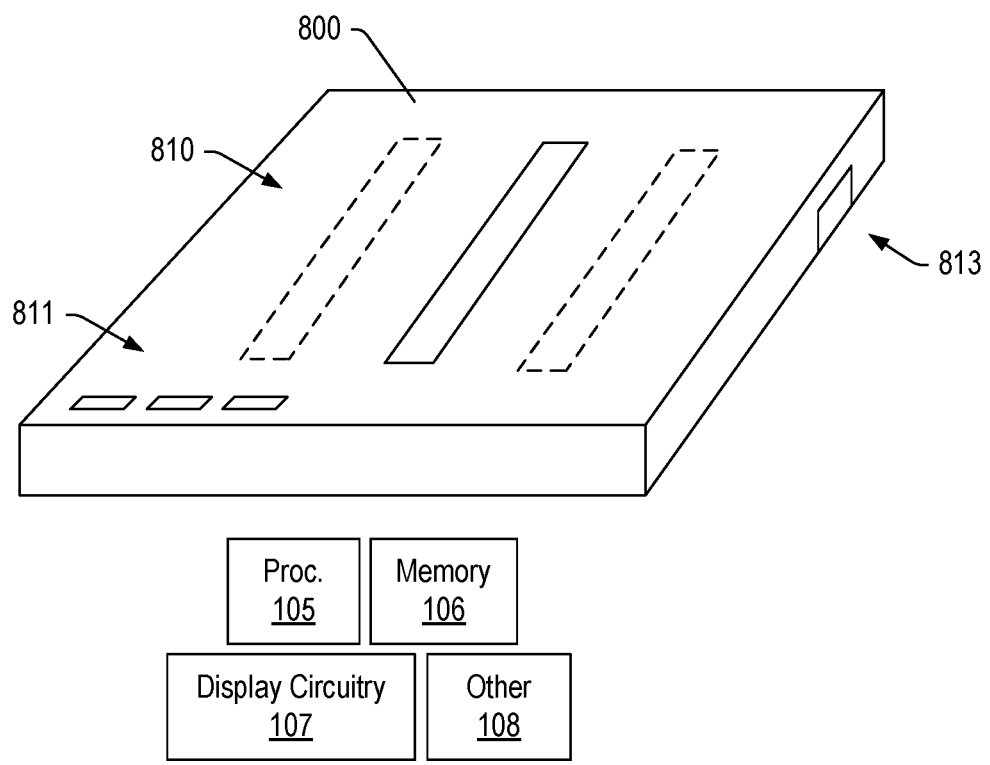
FIG. 12 is a perspective view of an example of a unit.

FIG. 12 shows an example of the unit 800 as including one or more openings 810, one or more connectors 811 and one or more interfaces 813. As shown in FIG. 12, the unit 800 may include the one or more processors 105, the memory 106, display circuitry 107 and/or the other circuitry 108. As an example, the unit 800 may be provided as a computing resource unit that includes a translation mechanism such as, for example, one or more rail assemblies. In such an example, the unit 800 may electrically couple to a display housing via one or more of the one or more interfaces 813 and may receive power and/or data via one or more of the one or more connectors 811. As an example, as explained with respect to FIGS. 11A, 11B and 11C, a connector or connectors may be within the unit 800 such as disposed within one of the one or more openings 810.

As an example, a display system can include a stand that includes a base and an arm that extends from the base to an end portion of the arm; and a display housing that includes a display, a rail assembly and an arm socket, translatable via the rail assembly, that receives the end portion of the arm. In such an example, the rail assembly can include a guide rail that seats a slider and where the arm socket is carried by the slider.

As an example, a display system can include a rotation assembly that defines a rotational axis, where a display housing is rotatable about the rotational axis. In such an example, the rotation assembly may be fixed to the arm or a rail assembly of a unit may carry the rotation assembly where the rotation assembly is translatable via the rail assembly.

As an example, a display system can include an arm that includes a plate that extends from the base to the end portion. In such an example, the plate may define an arm plane, where a display defines a display plane, and where the arm plane and the display plane are orthogonal. As an example, an arm may be formed at least in part from a metallic plate.

As an example, a display system can include a first arm and a second arm, along with a first arm socket that receives an end portion of a first arm and a second arm socket that receives an end portion of the second arm.

As an example, an end portion of an arm can be received by an arm socket via a coupling assembly. In such an example, the coupling assembly may include at least one magnet and/or at least one spring. As an example, a coupling assembly may include a locking mechanism that may include a peg, a ball, a socket, a receptacle, etc. As an example, an end portion of an arm may be removable from a coupling assembly via force. For example, consider an amount of force that overcomes a magnetic attraction force where one or more spring biased locators may be forcibly moved during decoupling (see, e.g., FIG. 10A and FIG. 11C).

As an example, a stand can include an electrical power conductor electrically coupled to an electrical power connector, where a display housing includes an electrical power connector that operatively couples to the electrical power connector of the stand. In such an example, the electrical power connector of the stand can be disposed at an end portion of an arm. As an example, a display can include display circuitry electrically coupled to an electrical power connector of a display housing where power is supplied via an end portion of an arm.

As an example, a display system can include a rail assembly that includes an electric motor. In such an example, an arm socket may be translatable via operation of the electric motor to translate a display housing with respect to a stand and/or where the display housing is rotatable with respect to the stand via operation of the electric motor.

As an example, an arm can be immovably fixed to a base via an upright portion of a fixed length that extends to an end portion of the arm.

As an example, a display housing can include a cartridge, where a rail assembly and the arm socket are carried by the cartridge. In such an example, the cartridge can include at least one processor and memory accessible to the processor.

As an example, a display system can include one or more processors and memory accessible to at least one of the one or more processors. In such an example, the display system may be an all-in-one (AIO) type of computing system that includes various cable connectors where the display system can be coupled to an arm, which may be coupled to a base where the arm and the base form a stand.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 13:
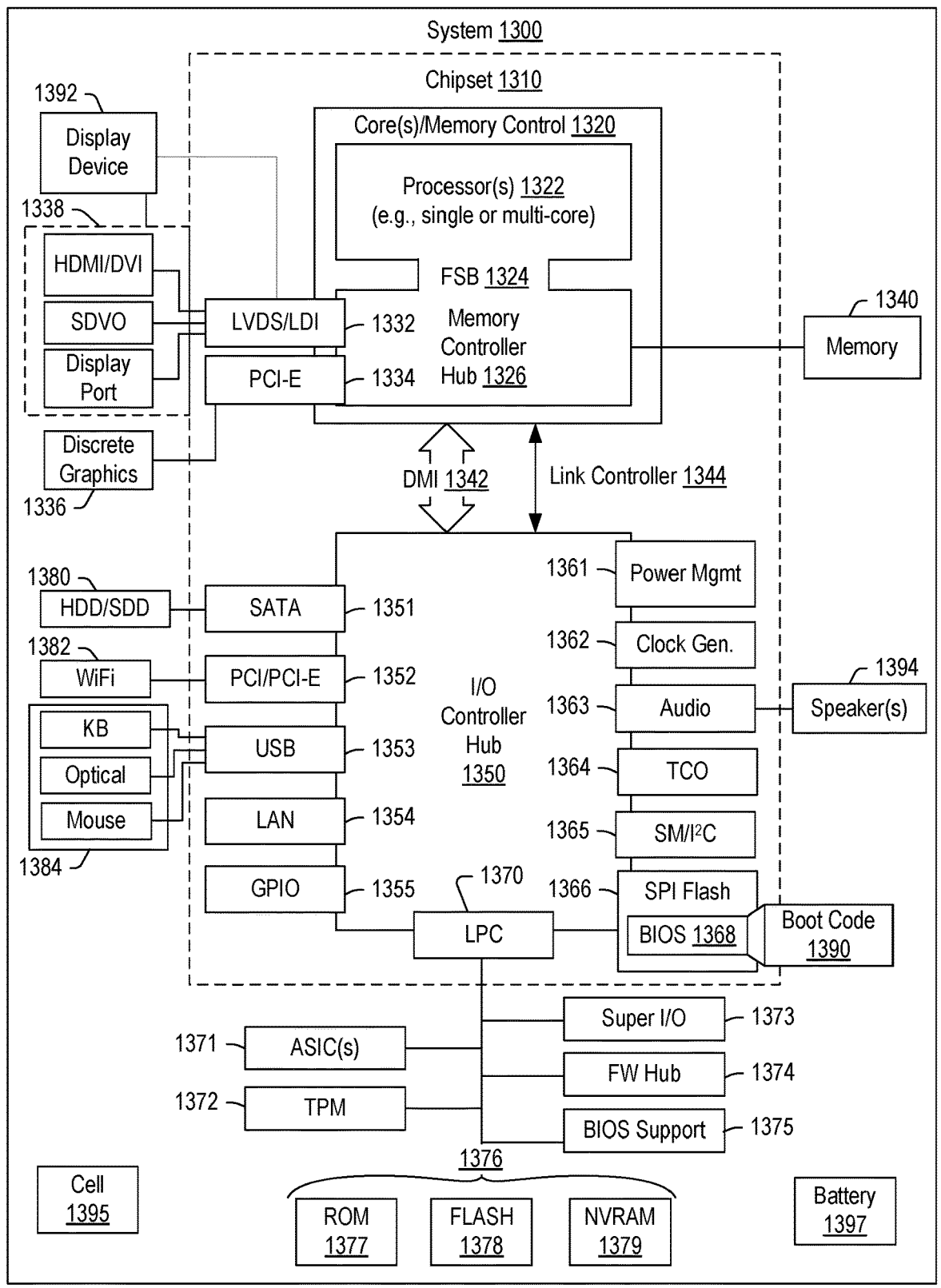
FIG. 13 is a diagram of an example of a system.

While various examples of circuits or circuitry have been discussed, FIG. 13 depicts a block diagram of an illustrative computer system 1300. The system 1300 may be a computer system sold by Lenovo (US) Inc. of Morrisville, N.C. (e.g., a THINKSTATION® system, etc.); however, as apparent from the description herein, a satellite, a base, a display, a computing device, a computing system, a server or other machine may include one or more features and/or other features of the system 1300.

As an example, a monitor or display may include features such as one or more of the features included in one of the LENOVO® IDEACENTRE® or THINKCENTRE® "all-in-one" (AIO) computing devices or systems (e.g., sold by Lenovo (US) Inc. of Morrisville, N.C.). For example, the LENOVO® IDEACENTRE® A720 computing system includes an Intel® Core i7 processor, a 27 inch frameless multi-touch display (e.g., for HD resolution of 1920×1080), a NVIDIA® GeForce® GT 630M 2 GB graphics card, 8 GB DDR3 memory, a hard drive, a DVD reader/writer, integrated Bluetooth® and 802.11b/g/n Wi-Fi®, USB connectors, a 6-in-1 card reader, a webcam, HDMI in/out, speakers, and a TV tuner.

As shown in FIG. 13, the system 1300 includes a so-called chipset 1310. A chipset refers to a group of integrated circuits, or chips, that are designed to work together. Chipsets are usually marketed as a single product (e.g., consider chipsets marketed under the brands INTEL®, AMD®, etc.).

In the example of FIG. 13, the chipset 1310 has a particular architecture, which may vary to some extent depending on brand or manufacturer. The architecture of the chipset 1310 includes a core and memory control group 1320 and an I/O controller hub 1350 that exchange information (e.g., data, signals, commands, etc.) via, for example, a direct management interface or direct media interface (DMI) 1342 or a link controller 1344. In the example of FIG.

13, the DMI 1342 is a chip-to-chip interface (sometimes referred to as being a link between a "northbridge" and a "southbridge").

The core and memory control group 1320 include one or more processors 1322 (e.g., single core or multi-core) and a memory controller hub 1326 that exchange information via a front side bus (FSB) 1324. As described herein, various components of the core and memory control group 1320 may be integrated onto a single processor die, for example, to make a chip that supplants the conventional "northbridge" style architecture.

The memory controller hub 1326 interfaces with memory 1340. For example, the memory controller hub 1326 may provide support for DDR SDRAM memory (e.g., DDR, DDR2, DDR3, etc.). In general, the memory 1340 is a type of random-access memory (RAM). It is often referred to as "system memory".

The memory controller hub 1326 further includes a low-voltage differential signaling interface (LVDS) 1332. The LVDS 1332 may be a so-called LVDS Display Interface (LDI) for support of a display device 1392 (e.g., a CRT, a flat panel, a projector, etc.). A block 1338 includes some examples of technologies that may be supported via the LVDS interface 1332 (e.g., serial digital video, HDMI/DVI, display port). The memory controller hub 1326 also includes one or more PCI-express interfaces (PCI-E) 1334, for example, for support of discrete graphics 1336. Discrete graphics using a PCI-E interface has become an alternative approach to an accelerated graphics port (AGP). For example, the memory controller hub 1326 may include a 16-lane (x16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1350 includes a variety of interfaces. The example of FIG. 13 includes a SATA interface 1351, one or more PCI-E interfaces 1352 (optionally one or more legacy PCI interfaces), one or more USB interfaces 1353, a LAN interface 1354 (more generally a network interface), a general purpose I/O interface (GPIO) 1355, a low-pin count (LPC) interface 1370, a power management interface 1361, a clock generator interface 1362, an audio interface 1363 (e.g., for speakers 1394), a total cost of operation (TCO) interface 1364, a system management bus interface (e.g., a multi-master serial computer bus interface) 1365, and a serial peripheral flash memory/controller interface (SPI Flash) 1366, which, in the example of FIG. 13, includes BIOS 1368 and boot code 1390. With respect to network connections, the I/O hub controller 1350 may include integrated gigabit Ethernet controller lines multiplexed with a PCI-E interface port. Other network features may operate independent of a PCI-E interface.

The interfaces of the I/O hub controller 1350 provide for communication with various devices, networks, etc. For example, the SATA interface 1351 provides for reading, writing or reading and writing information on one or more drives 1380 such as HDDs, SDDs or a combination thereof. The I/O hub controller 1350 may also include an advanced host controller interface (AHCI) to support one or more drives 1380. The PCI-E interface 1352 allows for wireless connections 1382 to devices, networks, etc. The USB interface 1353 provides for input devices 1384 such as keyboards (KB), one or more optical sensors, mice and various other devices (e.g., microphones, cameras, phones, storage, media players, etc.). On or more other types of sensors may optionally rely on the USB interface 1353 or another interface (e.g., I²C, etc.). As to microphones, the system 1300 of FIG. 13 may include hardware (e.g., audio card) appropriately configured for receipt of sound (e.g., user voice, ambient sound, etc.).

In the example of FIG. 13, the LPC interface 1370 provides for use of one or more ASICs 1371, a trusted platform module (TPM) 1372, a super I/O 1373, a firmware hub 1374, BIOS support 1375 as well as various types of memory 1376 such as ROM 1377, Flash 1378, and non-volatile RAM (NVRAM) 1379. With respect to the TPM 1372, this module may be in the form of a chip that can be used to authenticate software and hardware devices. For example, a TPM may be capable of performing platform authentication and may be used to verify that a system seeking access is the expected system.

The system 1300, upon power on, may be configured to execute boot code 1390 for the BIOS 1368, as stored within the SPI Flash 1366, and thereafter processes data under the control of one or more operating systems and application software (e.g., stored in system memory 1340). An operating system may be stored in any of a variety of locations and accessed, for example, according to instructions of the BIOS 1368. Again, as described herein, a satellite, a base, a server or other machine may include fewer or more features than shown in the system 1300 of FIG. 13. Further, the system 1300 of FIG. 13 is shown as optionally include cell phone circuitry 1395, which may include GSM, CDMA, etc., types of circuitry configured for coordinated operation with one or more of the other features of the system 1300.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A display system comprising:
a stand that comprises a base and an arm that extends from the base, wherein the arm comprises an end portion; and
a display housing that comprises a display, a cartridge, a rail assembly and an arm socket, translatable via the rail assembly, that receives the end portion of the arm, wherein the rail assembly and the arm socket are carried by the cartridge.

2. The display system of claim 1, wherein the rail assembly comprises a guide rail that seats a slider and wherein the arm socket is carried by the slider.

3. The display system of claim 1, comprising a rotation assembly that defines a rotational axis, wherein the display housing is rotatable about the rotational axis.

4. The display system of claim 3, wherein the rotation assembly is fixed to the arm.

5. The display system of claim 3, wherein the rail assembly carries the rotation assembly and the rotation assembly is translatable via the rail assembly.

6. The display system of claim 1, wherein the arm comprises a plate that extends from the base to the end portion.

7. The display system of claim 6, wherein the plate defines an arm plane, wherein the display defines a display plane, and wherein the arm plane and the display plane are orthogonal.

8. The display system of claim 1, wherein the arm is a first arm, wherein the stand comprises a second arm, wherein the arm socket is a first arm socket, and wherein the display housing comprises a second arm socket that receives an end portion of the second arm.

9. The display system of claim 1, wherein the end portion of the arm is received by the arm socket via a coupling assembly.

10. The display system of claim 9, wherein the coupling assembly comprises at least one magnet.

11. The display system of claim 9, wherein the coupling assembly comprises at least one spring.

12. The display system of claim 1, wherein the stand comprises an electrical power conductor electrically coupled to an electrical power connector, wherein the display housing comprises an electrical power connector that operatively couples to the electrical power connector of the stand.

13. The display system of claim 12, wherein the electrical power connector of the stand is disposed at the end portion of the arm.

14. The display system of claim 12, wherein the display comprises display circuitry electrically coupled to the electrical power connector of the display housing.

15. The display system of claim 1, wherein the rail assembly comprises an electric motor.

16. The display system of claim 15, wherein the arm socket is translatable via operation of the electric motor to translate the display housing with respect to the stand.

17. The display system of claim 15, wherein the display housing is rotatable with respect to the stand via operation of the electric motor.

18. The display system of claim 1, wherein the arm is immovably fixed to the base via an upright portion of a fixed length that extends to the end portion of the arm.

19. The display system of claim 1, wherein the cartridge comprises at least one processor and memory accessible to the processor.

20. The display system of claim 1, wherein the cartridge is detachable from the display housing.

* * * * *